United States Patent [19]

Bolton et al.

[11] 4,197,142
[45] Apr. 8, 1980

[54] PHOTOCHEMICAL DEVICE FOR CONVERSION OF VISIBLE LIGHT TO ELECTRICITY

[75] Inventors: James R. Bolton; Abram F. Janzen, both of London, Canada

[73] Assignee: Canadian Patents & Development Ltd., Ottawa, Canada

[21] Appl. No.: 18,468

[22] Filed: Mar. 7, 1979

[51] Int. Cl.² ............................................. H01L 31/06
[52] U.S. Cl. .......................... 136/89 SJ; 136/89 NB; 250/211 R; 250/211 J; 250/212; 357/8; 357/15; 357/30
[58] Field of Search ....................... 136/89 SJ, 89 NB; 429/111; 357/8, 15, 30; 250/211 R, 211 J, 212

[56] References Cited

U.S. PATENT DOCUMENTS

| 3,057,947 | 10/1962 | Calvin et al. | 136/89 |
| 4,105,470 | 8/1978 | Skotheim | 136/89 SJ |

OTHER PUBLICATIONS

P. J. Reucroft et al. "Photoelectronic Effects In Organic Materials-I. Chlorophyll-Chloranil Lamellar Systems", Photochem. Photobiol., vol. 10, pp. 79-86, (1969).
"'Synthetic Leaf' Mimics Plants' Light Conversion," Chemical & Eng. News, Feb. 16, 1976, pp. 32-34.
C. W. Tang et al., "Photovoltaic Effects of Metal--Chlorophyll-a-Metal Sandwich Cells," J. Chem., Phys., vol. 62, pp. 2139-2149, (1975).

Primary Examiner—Aaron Weisstuch
Attorney, Agent, or Firm—J. R. Hughes

[57] ABSTRACT

A photochemical device for conversion of visible light to electricity comprising one or more monolayers of dye material such as chlorophyll, an electron acceptor monolayer of saturated fatty acid between suitable electrode layers, all formed or mounted on a suitable substrate sheet.

9 Claims, 5 Drawing Figures

PHOTOCHEMICAL DEVICE FOR CONVERSION OF VISIBLE LIGHT TO ELECTRICITY

This invention relates to solar energy converters and more particularly to photochemical devices for converting visible light to electrical energy.

Photocells in use at present involve semiconductors such as: (1) single crystals of silicon or GaAs, (2) photoelectrochemical regenerative cells utilizing an aqueous electrolyte solution, and (3) amorphous films of dyes placed between two electrodes. The limitation on the use of the first two is the high cost e.g. $10,000/kilowatt and of the third, the low efficiency of conversion.

Chlorophyll monolayers have been thoroughly characterized by earlier investigators. S. M. Costa and G. Porter in Proc. Roy. Soc. Lond. A. 341, 167–176 (1974) and J. M. Harris in Ph. D. Dissertation, University of London, 1970, have investigated the effect of various acceptors on the spectroscopic properties of chlorophyll monolayers and found that quenching of fluorescence is likely due to electron transfer to the acceptors. Photoconductivity in chlorophyll monolayers was first observed by R. C. Nelson, J. Chem. Phys. 27, 864–867 (1957) and photovoltaic experiments on a system consisting of chlorophyll monolayers and sublimed chloranil as an acceptor were reported by P. J. Reucroft and W. H. Simpson, Photochem. Photobiol. 10, 79–86 (1969).

It is an object of the present invention to provide a photochemical device for conversion of solar energy to electrical energy that has relatively good efficiency and which is cheap to manufacture.

This and other objects of the invention are achieved by a photochemical device comprising one or more monolayers of dye material such as chlorophyll, an electron acceptor monolayer of saturated fatty acid between suitable electrode layers, all formed or mounted on a suitable substrate sheet.

In drawings which illustrate an embodiment of the invention,

Figure 1:
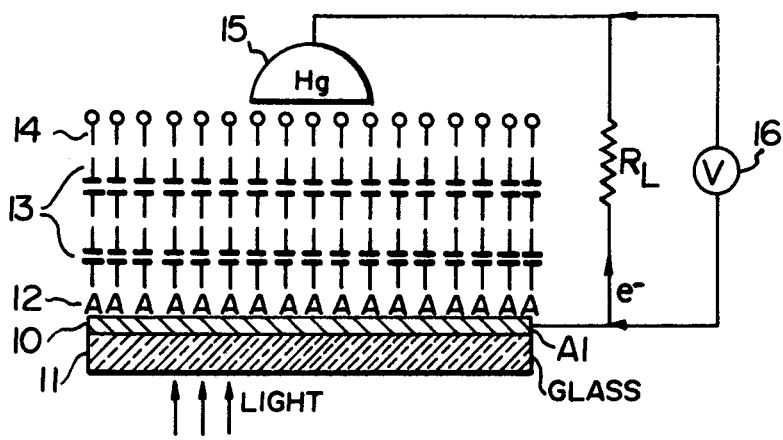
FIG. 1 is a schematic view of an experimental photocell and output circuit.

Referring to FIG. 1, a schematic representation of a cell and circuit is shown. A semi-transparent aluminum electrode 10 is evaporated onto a glass substrate layer 11. A monolayer of an acceptor 12 (designated as a line of A's) such as plastoquinone (about 11%) in stearic acid, one or more monolayers of chlorophyll 13, and a monolayer of stearic acid 14 acting as a buffer are laid on the acceptor layer. These monolayers are applied using a technique described by H. Kuhn in Chem. Phys. Lipids 8, 401–404, 1972 and by H. Kuhn et al in Physical Methods of Chemistry, Part III B, 645–702, Wiley-Interscience, New York, 1972. A drop of mercury 15 acting as the positive electrode and the aluminum electrode are connected across a load $R_L$. The mercury layer may be replaced by an electrochemical solution. In this case the buffer layer is not needed. When light strikes the device, a photo-induced electron current $e^-$ flows through the load resistance as measured by voltmeter 16.

All cells constructed as in FIG. 1 exhibited rectifying behaviour and responded to light by generating photocurrents and photovoltages. The photocurrent increased with the number of chlorophyll layers up to 4 but did not increase further for more that 4 layers of chlorophyll. That chlorophyll is photooxidized by the light was confirmed by electron spin resonance (ESR) experiments in which an ESR spectrum of the chlorophyll cation radical was detected. The action spectrum of the photocurrent follows that of the absorption spectrum of chlorophyll.

Figure 2:
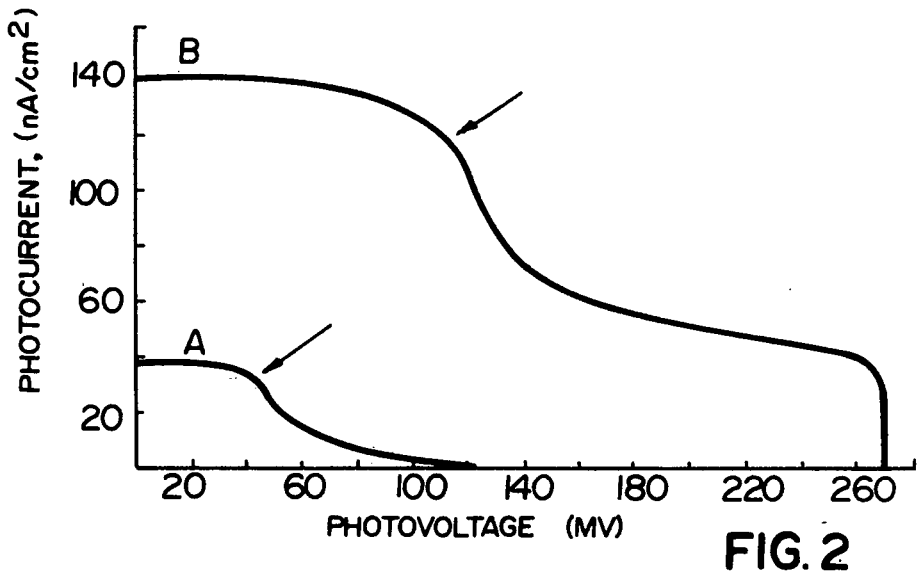
FIG. 2 is a plot of photocurrent vs photovoltage for two systems.

FIG. 2 shows photocurrent-photovoltage plots for two types (A and B) of acceptor layer. Type A corresponds to cells in which the acceptor contained fully saturated aliphatic chains such as pure stearic acid. In this case the conversion efficiency was found to be very low ($\sim 10^{-3}\%$) for absorbed red light and furthermore the photocurrent is proportional to the square of the light intensity at low light levels indicating a biphotonic mechanism. This mechanism is further substantiated by a double flash experiment in which the photocurrent drops when flashes are spaced longer than $\sim 1.5$ ms. The triplet lifetime of chlorophyll a is known to be 1.7 ms.

Figure 3A:
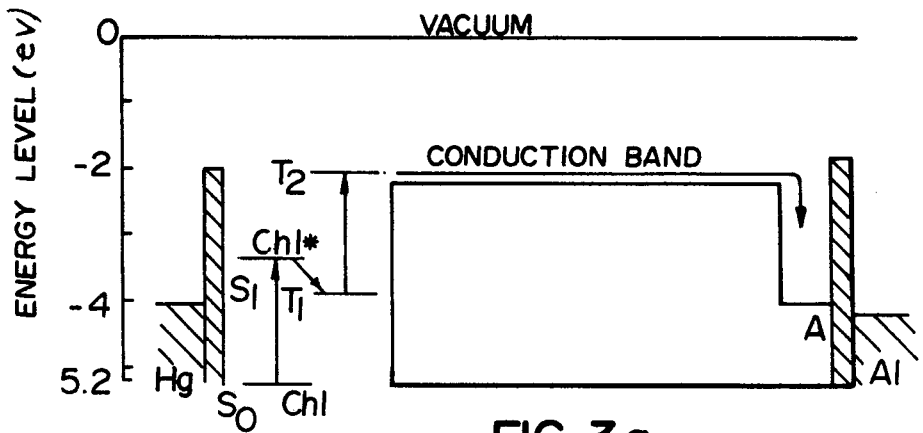
FIGS. 3a and 3b are graphs of energy-level schemes for the two systems.

For type A cells it is considered that the energy-level scheme to be that of FIG. 3a. Chlorophyll is excited by two photons (via the intermediate triplet state $T_1$) to the second excited triplet state $T_2$ where electron transfer into the conduction band of the lipid occurs. The triplet manifold must be involved because incorporation of $\beta$-carotene (an efficient triplet quencher) into the chlorophyll layers completely eliminates the photoelectric response.

In Type B cells, the only change is to incorporate $\sim 10$ mole % of either plastoquinone (I) or ubiquinone (II) into a stearic acid acceptor layer. The photoresponse of the cell improves dramatically (see Curve B of FIG. 2) with a power conversion efficiency over ten times better ($\sim 10^{-2}\%$) than for Type A cells. Now the photocurrent is proportional to the first power of the light intensity indicating a monophotonic process. It is considered that electron tunnelling directly from $T_1$ is the mechanism as is shown in FIG. 3b.

Plastoquinone and ubiquinone have two features—a long polyisoprene side chain with a double bond every fourth carbon atom and a quinone head group. Apparently the latter has little effect on the photoelectric behaviour as chemical reduction of the quinone does not affect the response significantly. Indeed, substitution of the natural quinone by the simple polyisoprene chain, squalene, or even by certain unsaturated fatty acids (such as linoleic acid) resulted in a higher efficiency Type B cell.

Figure 3B:
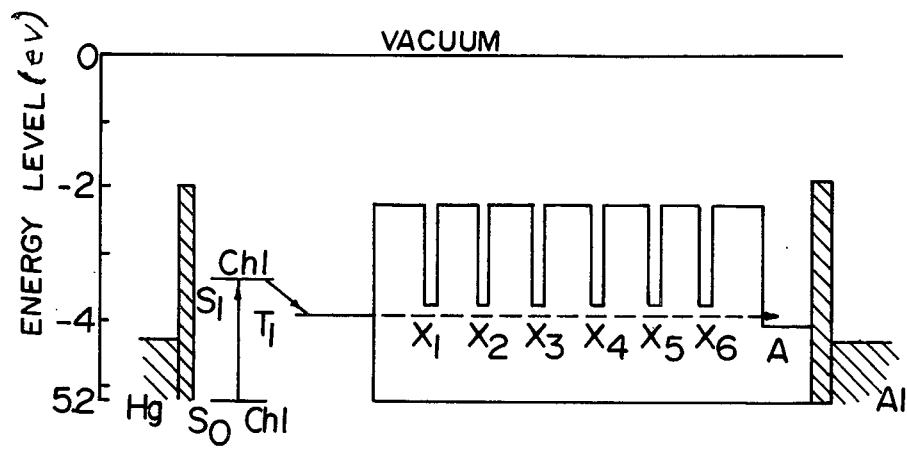

It is considered that the double bonds in the acceptor layer provide a sufficient local lowering of the energy barrier so that quantum-mechanical electron tunnelling is permitted from $T_1$ directly to the aluminum electrode as shown in FIG. 3b. Molecular models show that in the polyisoprene chain the head to tail distance from one double bond to the next is only $\sim 2.5°$ Å.

Figure 4:
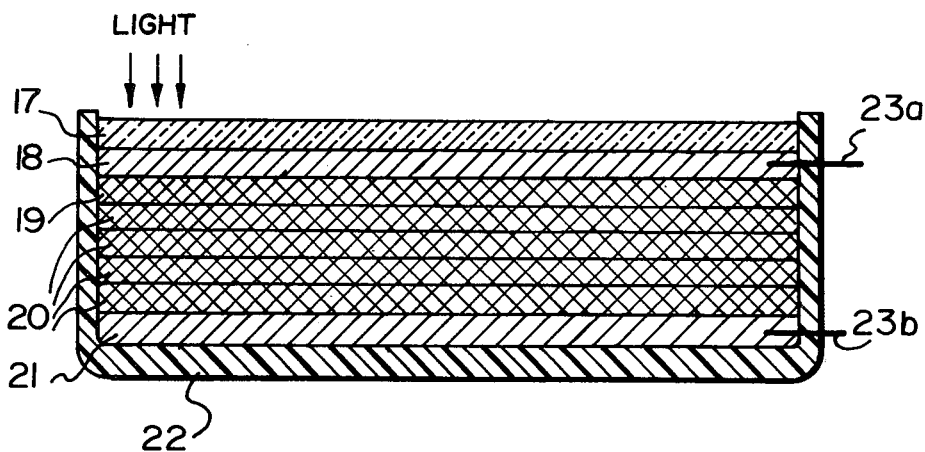
FIG. 4 is a cross-section of a practical photocell device.

FIG. 4 is a cross-sectional view of the device in typical physical form. A glass plate 17 has formed on it: a semi-transparent electrode material layer 18; an acceptor layer 19; a dye layer (one or more monolayers) 20; and a counter electrode layer 21. The device is completed by an encapsulation layer 22 and electrical connections to the electrodes 23a and 23b. Although light would normally enter through the glass plate, the device could be designed to have light enter through the counter electrode side provided transparent or semi-transparent materials are used for the apropriate layers.

The materials for the various layers are as follows:

Electrode 18 must be conducting, transparent or semi-transparent, and must form a Schottky barrier at its interface with the acceptor layer. Examples of suitable materials are a semi-transparent aluminum film or a tin oxide semiconductor layer.

The acceptor layer 19 is formed of one monolayer of saturated fatty acid e.g. stearic acid containing about 10 mole % of one of plastoquinone, ubiquinone, squalene or some unsaturated fatty acid. This material must contain a certain concentration of double bonds in the molecules.

The dye layer 20 (one or more monolayers) consists of chlorophyll or the dioctadecyl ester of Tris (2-2' bipyridyl) Ruthenium II+. Other possible materials are porphyrins, acridine dyes, and Azo dyes. A buffer layer of e.g. stearic acid may be helpful between dye layers and counter electrode.

The counter electrode 21 must make good ohmic contact with the dye layers and should be a good source of electrons. Examples of suitable materials are a mercury droplet as shown in FIG. 1 or an aqueous solution of 0.1 M $Na_2SO_4$ and 0.05 M hydroquinone.

We claim:

1. A photochemical device for converting light energy to electrical energy comprising:
   (a) a substrate sheet,
   (b) a layer of conducting electrode material formed on the substrate,
   (c) a monolayer of an electron acceptor material formed on the electrode layer, said electrode layer forming a Schottky barrier between it and the acceptor monolayer,
   (d) at least one monolayer of a dye material formed on the acceptor layer,
   (e) a counter electrode of a material that is a good source of electrons, contacting the dye layers, either the substrate sheet and its associated electrode layer or the counter electrode being transparent such that light may enter the monolayers, and
   (f) means for taking electric current from the electrodes.

2. A photochemical device as in claim 1 wherein the acceptor monolayer is a saturated fatty acid containing about 10 mole % of one of plastoquinone, ubiquinone, squalene, or an unsaturated fatty acid.

3. A photochemical device as in claim 1 wherein the at least one dye monolayer is chlorophyll.

4. A photochemical device as in claim 3 wherein the electrode layer is a semitransparent tin oxide semi-conductor layer.

5. A photochemical device as in claim 1 wherein the at least one dye monolayer is a material chosen from the groups: dioctadecyl ester of Tris (2-2' bipyridyl) Ruthenium II+, porphyrin, acridine dyes, and Azo dyes.

6. A photochemical device as in claim 1 wherein the electrode layer is a semitransparent aluminum film and the substrate sheet is glass.

7. A photochemical device as in claim 1 wherein the number of dye monolayers is four.

8. A photochemical device as in claim 1 wherein the counter electrode is mercury.

9. A photochemical device as in claim 1 wherein a buffer layer of stearic acid is positioned between the counter electrode and the at least one monolayer of dye material.

* * * * *